(12) United States Patent
Ramachandran et al.

(10) Patent No.: US 10,950,475 B1
(45) Date of Patent: Mar. 16, 2021

(54) METHOD AND APPARATUS FOR PROCESSING A SUBSTRATE USING NON-CONTACT TEMPERATURE MEASUREMENT

(71) Applicant: APPLIED MATERIALS, INC., Santa Clara, CA (US)

(72) Inventors: Vinodh Ramachandran, Singapore (SG); Ananthkrishna Jupudi, Singapore (SG); Cheng-Hsiung Tsai, Cupertino, CA (US); Yueh Sheng Ow, Singapore (SG); Preetham P. Rao, Singapore (SG); Ribhu Gautam, Singapore (SG); Prashant Agarwal, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/545,537

(22) Filed: Aug. 20, 2019

(51) Int. Cl.
*H01L 21/67* (2006.01)
*H01L 21/324* (2006.01)
*H05B 6/64* (2006.01)
*H01L 21/66* (2006.01)
*G01J 5/10* (2006.01)

(52) U.S. Cl.
CPC ...... *H01L 21/67248* (2013.01); *H01L 21/324* (2013.01); *H01L 21/67115* (2013.01); *H01L 22/26* (2013.01); *H05B 6/6435* (2013.01); *H05B 6/6455* (2013.01); *G01J 5/10* (2013.01)

(58) Field of Classification Search
CPC ............. H01L 21/67–68792; H01L 21/67248
See application file for complete search history.

(56) References Cited

U.S. PATENT DOCUMENTS

| | | | |
|---|---|---|---|
| 5,388,909 | A | 2/1995 | Johnson et al. |
| 6,813,034 | B2 | 11/2004 | Rosencwaig et al. |
| 6,972,852 | B2 | 12/2005 | Opsal et al. |
| 7,046,376 | B2 | 5/2006 | Sezginer |
| 2007/0093044 | A1 | 4/2007 | Rijpers et al. |
| 2017/0125308 | A1 | 5/2017 | Hung |
| 2018/0254208 | A1* | 9/2018 | Chang .................... G01J 5/047 |
| 2018/0323092 | A1* | 11/2018 | Rao ................... H01L 21/67253 |

FOREIGN PATENT DOCUMENTS

| | | | |
|---|---|---|---|
| CN | 106711063 | A * | 5/2017 |
| CN | 106711063 | A | 5/2017 |
| KR | 10-1116859 | B1 | 6/2012 |
| KR | 101773373 | B1 | 2/2013 |

OTHER PUBLICATIONS

International Search Report for PCT/US2020/030741, dated Aug. 14, 2020.

* cited by examiner

*Primary Examiner* — Selim U Ahmed
*Assistant Examiner* — Evan G Clinton
(74) *Attorney, Agent, or Firm* — Moser Taboada

(57) ABSTRACT

Methods and apparatus for processing a substrate are provided. The apparatus, for example, can include a process chamber comprising a chamber body defining a processing volume and having a view port coupled to the chamber body; a substrate support disposed within the processing volume and having a support surface to support a substrate; and an infrared temperature sensor (IRTS) disposed outside the chamber body adjacent the view port to measure a temperature of the substrate when being processed in the processing volume, the IRTS movable relative to the view port for scanning the substrate through the view port.

17 Claims, 9 Drawing Sheets

METHOD AND APPARATUS FOR PROCESSING A SUBSTRATE USING NON-CONTACT TEMPERATURE MEASUREMENT

FIELD

Embodiments of the present disclosure generally relate to substrate processing, and more particularly, to methods and apparatus for processing a substrate using non-contact temperature measurement.

BACKGROUND

Fanout packaging wafers (substrates) are composite in structure, and contain silicon dies of varying dimensions that are packaged on, for example, an epoxy substrate. Typically, the wafers are heated in a low-pressure chamber condition, and non-contact temperature measurements can be used to monitor a temperature of the wafers. The temperature of the wafers is controlled so that the wafers do not become damaged, e.g., due to warping. Due to the heterogeneous structure of the wafer, however, accurately measuring the wafer temperature with a normal incidence infrared (IR) sensor is difficult, since the temperature measurement mainly depends on an emissivity of a substance that the IR sensor views. Additionally, customer wafer patterns are frequently unknown, thus design of an IR sensor architecture and calibration for normal incidence is difficult, as the IR sensor can detect, capture, or otherwise determine different materials.

SUMMARY

Methods and apparatus for processing a substrate are provided herein. In some embodiments, an apparatus for processing a substrate can include a process chamber comprising a chamber body defining a processing volume and having a view port coupled to the chamber body; a substrate support disposed within the processing volume and having a support surface to support a substrate; and an infrared temperature sensor (IRTS) disposed outside the chamber body adjacent the view port to measure a temperature of the substrate when being processed in the processing volume, the IRTS movable relative to the view port for scanning the substrate through the view port.

In accordance with some embodiments, a method for substrate packaging can include positioning a substrate on a support surface of a substrate support disposed within a processing volume of a process chamber comprising a chamber body and a view port coupled to the chamber body; providing an infrared temperature sensor (IRTS) outside of the chamber body adjacent the view port; moving the IRTS relative to the view port to scan the substrate through the view port; and measuring a temperature of the substrate while the substrate is being processed in the processing volume.

In accordance with some embodiments, a non-transitory computer readable storage medium having stored thereon instructions that when executed by a processor cause the processor to perform a method for substrate packaging that can include positioning a substrate on a support surface of a substrate support disposed within a processing volume of a process chamber comprising a chamber body and a view port coupled to the chamber body; providing an infrared temperature sensor (IRTS) outside of the chamber body adjacent the view port; moving the IRTS relative to the view port to scan the substrate through the view p; and measuring a temperature of the substrate while the substrate is being processed in the processing volume.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
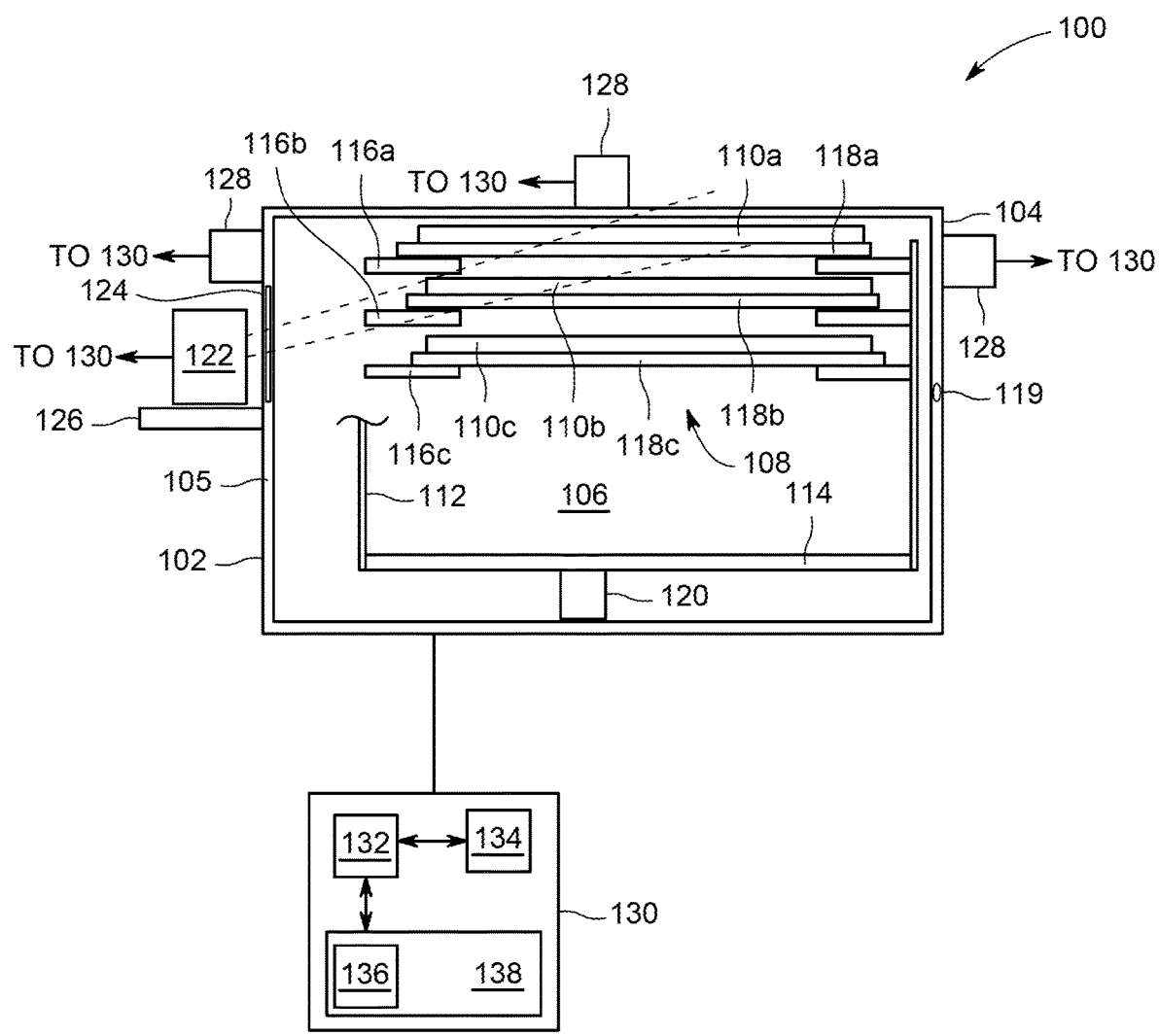
FIG. 1 is a schematic view of a process chamber including a temperature measuring apparatus in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus using various types of non-contact measurement, such as infrared based thermometry for packaging applications are provided herein. Particularly, the present disclosure overcomes the complications with temperature measurement of fan-out packaging substrate (or wafer). More particularly, by positioning an IR sensor at a relatively shallow angle with respect to an edge of the substrate (or wafers), a field of view can form, for example, an optical ellipse (or an elliptical field of view) on the substrate. The optical ellipse allows the IR sensor to scan the substrate surface and obtain a temperature of the substrate surface. Additionally, when the IR sensor is coupled to a linear up/down slide, the IR sensor can measure temperature of all wafers in a batch of wafers that are being processed.

FIG. 1 is a schematic view of an apparatus 100 including a process chamber 102 including a temperature measuring apparatus in accordance with one or more embodiments of the present disclosure. The process chamber 102 includes a chamber body 104 defined by sidewalls, a bottom portion, and a top portion. The chamber body 104 encloses a processing volume 106.

A multiple substrate holder 108 configured to support multiple substrates in a vertically spaced apart configuration (e.g., substrates 110a, 110b, and 110c having one or more electronics packages formed thereon). Although FIG. 1 shows one exemplary configuration, the present disclosure may be adapted for multiple substrate holders having other configurations as well, for example, in combination with the pedestal and/or the substrate support.

The multiple substrate holder 108 includes one or more vertical supports 112. In some embodiments, the vertical supports 112 may be supported by the bottom of the chamber body 104, for example via one more coupling elements such as fastening screws or the like. In some embodiments, for example, as depicted in FIG. 1B, the multiple substrate holder 108 optionally includes a bottom member 114 coupled to the one or more vertical supports 112 and for supporting the one or more vertical supports 112 (one vertical support 112 is shown in FIG. 1). The vertical supports 112 further include a plurality of peripheral members (e.g., peripheral members 116a, 116b, and 116c) extending radially inward from the vertical supports 112. The plurality of peripheral members 116a-116c are configured to support respective substrates 110a-110c supported and transported by substrate supports or carriers 118a, 118b, 118c. In some embodiments, the peripheral members 116a-116c are configured to directly hold and support the respective substrates 110a-110c.

The multiple substrate holder 108 further includes a lift assembly 120. The lift assembly 120 may include one or more of a motor, an actuator, or the like, to control the vertical position of the peripheral members 116a-116c. The vertical position of the peripheral members 116a-116c is controlled for placing and removing each of the substrate carrier 118a-118c and/or the substrates 110a-110c through the opening 119 (e.g., a slit valve opening) and onto or off the substrate support. The opening 119 is formed through one of the sidewalls at a height proximate the peripheral members 116a-116c to facilitate the ingress and egress of the substrates 110a-110c into the processing volume 106. In some embodiments, the opening 119 may be retractably sealable, for example, to control the pressure and temperature conditions of the processing volume 106.

In some embodiments, the process chamber 102 may include a heat source 128 disposed about the chamber body 104 or in the processing volume 106 (e.g., disposed in a pedestal, if such a device is used). In some embodiments, the heat source 128 may be a resistive heater, a convective heater, a radiative heater, or a microwave heater, or a combination of two or more types of heaters. In some embodiments, the chamber body 104 may be configured to receive and radiate microwave, convective, or other similar kinds of heat energy from one or more heat sources 128 disposed outside the chamber body 104 for processing the substrates 110a-110c.

The temperature sensing apparatus can include one or more infrared (IR) temperature sensors 122 (IRTS 122) provided outside of the process chamber 102. In some embodiments, the IRTS 122 can be a digital infrared sensor including a thermopile sensor that senses infrared electromagnetic energy. The IRTS 122 is mounted outside of the chamber body 104 adjacent to a view port 124, which is mounted within the process chamber 102 using any suitable mounting device, e.g., clamps, bolts, screws, gaskets, O-rings, etc., that is in-line with an aperture (not shown in FIG. 1) that is defined through the chamber body 104, as will be described in greater detail below. More particularly, the IRTS 122 is mounted on a bracket 126 coupled to a side 105 of the chamber body 104 and is movable in a vertical direction along the bracket 126, as will also be described in greater detail below. Although, FIG. 1 depicts one IRTS 122, when multiple IRTS 122 are provided, each will be positioned adjacent a corresponding view port that is in-line with a corresponding aperture.

A controller 130 is provided and coupled to various components of the process chamber 102 to control the operation of the process chamber 102 for processing the substrates 110a-110c. The controller 130 includes a central processing unit (CPU) 132, support circuits 134 and a memory or non-transitory computer readable storage medium 136. The controller 130 is operably coupled to and controls a power source, e.g., the heat source 128, and/or IRTS 122 directly, or via computers (or controllers) associated with a particular process chamber and/or support system components. Additionally, the controller 130 is configured to receive an input from the IRTS 122 in response to scanning the substrates 110a-110c and analyzes the input for controlling the power source such that a temperature of the substrates 110a-110c does not exceed a threshold while the substrates 110a-110c are being processed, as will be described in greater detail below.

The controller 130 may be any form of general-purpose computer processor that can be used in an industrial setting for controlling various chambers and sub-processors. The memory, or non-transitory computer readable storage medium, 136 of the controller 130 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 134 are coupled to the CPU 132 for supporting the CPU 132 in a conventional manner. These circuits include cache, power supplies, clock circuits, input/output circuitry and subsystems, and the like. Inventive methods as described herein, such as the method for substrate packaging, may be stored in the memory 136 as software routine 138 that may be executed or invoked to control the operation of the heat source 128 and/or IRTS 122 in the manner described herein. The software routine may also be stored and/or executed by a second CPU (not shown) that is remotely located from the hardware being controlled by the CPU 132.

Figure 2:
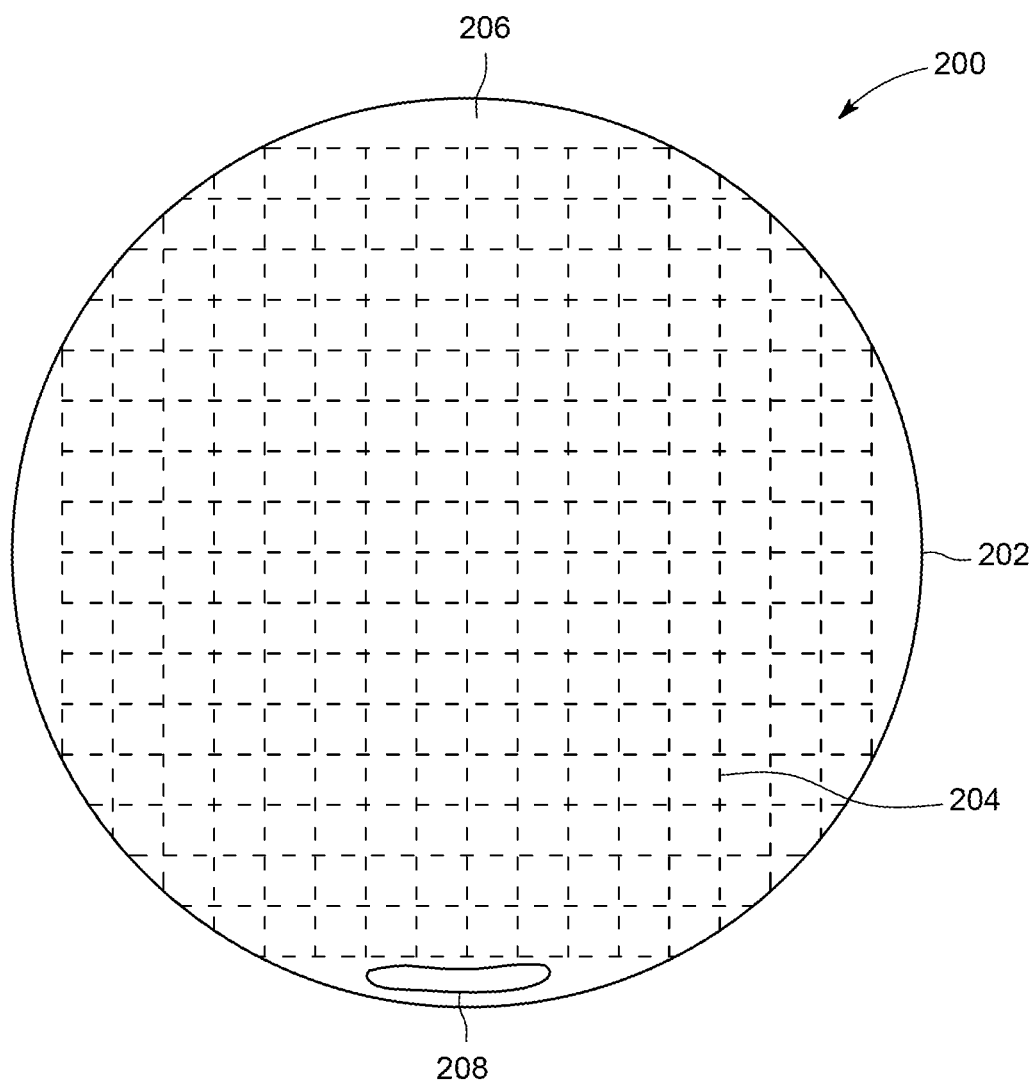
FIG. 2 is a schematic top view of an exemplary substrate for forming an electronics package in accordance with one or more embodiments of the present disclosure.

FIG. 2 is a schematic top view of an exemplary substrate (e.g., the substrates 110a-110c) for forming an electronics package in accordance with one or more embodiments of the present disclosure. For example, in some embodiments, each of the substrates 110a-110c may be a silicon wafer 200 (wafer 200). In some embodiments, the wafer 200 may comprise one or more polymers or metals suitable for electronics packaging applications. The wafer 200 is disposed on a substrate carrier (e.g., the substrate carries 118a-118c) discussed above and shown in FIG. 1. The wafer 200 has a body 202 having an upper surface area and an array of microcircuit dies 204 disposed on the body 202. An epoxy resin 206 is provided to create insulation between adjacently disposed microcircuit dies 204 and encapsulate the body 202. In some embodiments, the array of microcircuit dies 204 substantially covers the upper surface area of the body 202 (e.g., leaving only relatively small spaces between adjacent dies and an outer peripheral area of the upper surface area uncovered). In some embodiments, one or more portions of the body 202 having the epoxy resin 206 exclude the microcircuit dies 204. For example, in some embodiments, areas along the periphery of the body 202 may include the epoxy resin 206 and exclude the microcircuit dies 204.

The thickness of the epoxy resin 206 may be between about 600 micrometers to 900 micrometers depending on the amount of tolerable warpage for the material composition of epoxy. In some embodiments, the epoxy resin 206 may have a glass transition temperature between about 140° C. and about 150° C. The substrate carriers 118a-118c and the epoxy resin have a substantially similar coefficient of thermal expansion (CTE) (e.g., one CTE is no more than 10 percent different than the other CTE).

In some embodiments, the epoxy resin 206 may include a dopant 208. In some embodiments, for example as shown in FIG. 2, the dopant may be in the areas along the periphery of the body 202 including the epoxy resin 206, away from the array of microcircuit dies 204.

In some embodiments, the individual dies of the array of microcircuit dies 204 may be identical. In other embodiments, the individual dies of the array of microcircuit dies 204 may differ from each other. In some embodiments, the individual dies of the array of microcircuit dies 204 may be configured for use, for example, in memory, logic, communication, and sensing applications, although the microcircuit dies can be generally used in any application.

Figure 3A:
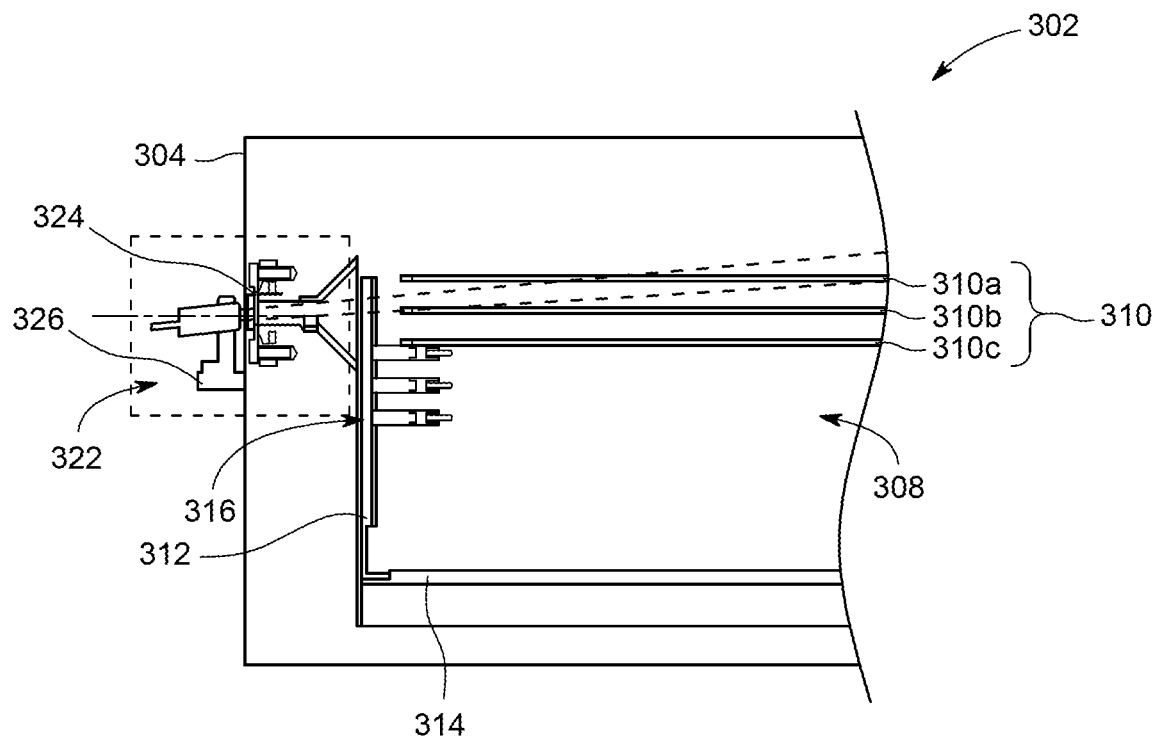
FIG. 3A is partial, side view of process chamber including a temperature measuring apparatus in accordance with one or more embodiments of the present disclosure.
Figure 3B:
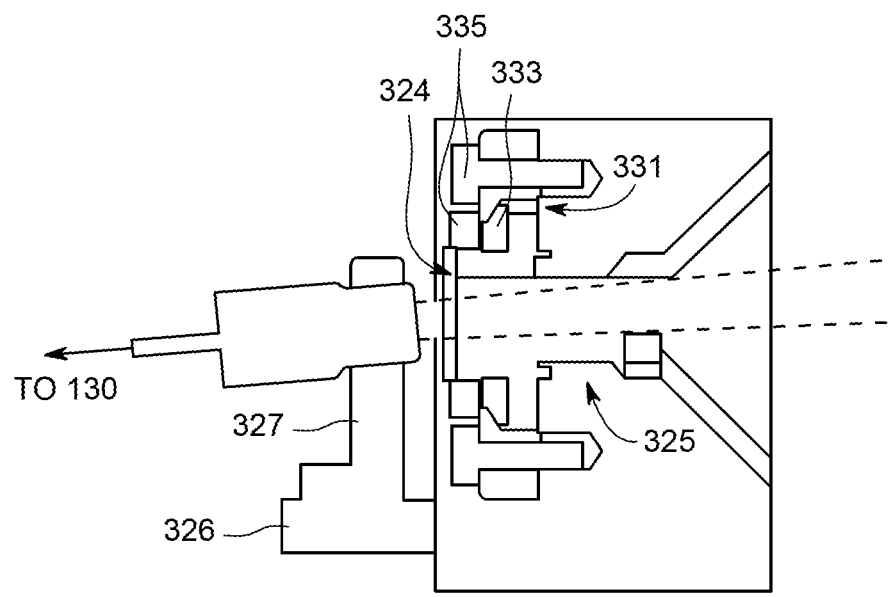
FIG. 3B is an enlarged area of detail of FIG. 3A.

FIG. 3A is partial, side view of process chamber including a temperature measuring apparatus, e.g., the IRTS 122, and FIG. 3B is an enlarged area of detail of FIG. 3A, in accordance with one or more embodiments of the present disclosure. The process chamber 302 is substantially identical to the process chamber 102. For example, the process chamber 302 includes a multiple substrate holder 308 that includes a bottom member 314 coupled to the one or more vertical supports 312 for supporting the one or more vertical supports 312 (one shown in FIG. 3A). The vertical supports 312 further include a plurality of peripheral members 316 extending radially inward from the vertical supports 312. The plurality of peripheral members 316 are configured to support respective substrates 310 supported and transported by substrate carriers. For clarity, the substrate carriers are not shown coupled to the peripheral members 316, and some of the peripheral members 316 have been removed. For illustrative purposes, the substrates 310 include, for example, a top substrate 310a, a middle substrate 310b, and a bottom substrate 310c.

As noted above, an IRTS 322 is disposed outside the chamber body of the process chamber 302 adjacent a view port 324 to measure a temperature of the substrates 310 when the substrates 310 are being processed in the processing volume of the process chamber 302. The view port 324, which can be made from quartz or other suitable material, is transparent to the IRTS 322 and vacuum seals the processing volume of the process chamber 302 to isolate the IRTS 322 from the processing volume of the process chamber 302.

The IRTS 322 is mounted on a bracket 326 that is coupled to a side of a chamber body 304. The bracket 326 can be coupled to the chamber body 304 using any suitable fixation device(s), such as screws, bolts, etc. In some embodiments, the bracket 326 and the chamber body 304 can be monolithically formed.

The IRTS 322 can be fixedly or movably coupled to the bracket 326. For example, in some embodiments, e.g., when there is a plurality of substrates 310, the IRTS 322 can be movable in a vertical direction relative to the view port 324 for scanning the substrates 310, as will be described in greater detail below. As depicted in FIG. 3B, the bracket 326 can include, for example, an upright post 327 (or pillar) on which the IRTS 322 can move along in the vertical direction. Accordingly, in some embodiments, an aperture of suitable configuration (not explicitly shown) can be defined through the IRTS 322 and configured to receive the post 327 of the bracket 326. Alternatively, the IRTS 322 can be side-mounted to the post 327 using one or more fixation devices, e.g., clamps, nuts, bolts, etc. One or more of actuators, motors, or drives (not explicitly shown), which can be controlled by a controller, e.g., the controller 130, can be coupled to the IRTS 322 and/or the bracket 326 and can be configured to move the IRTS 322 along the post 327 during operation.

In some embodiments, the IRTS 322 can be manually manipulated along the post 327, and one or more device(s) can be used to lock the IRTS 322 in one or more positions along the post 327. For example, a threaded aperture can be defined through a side of the IRTS 322. The threaded aperture can be configured to receive a corresponding threaded, knurled knob that can be rotated to drive a threaded portion of the knob through the threaded aperture of the IRTS 322 so that a distal end of the threaded portion can contact the post 327 and lock the IRTS 322 in one or more positions along the post 327.

Movement of the IRTS 322 along the post 327 will be such that any fixed position of the IRTS 322 relative to the view port 324 provides a field of view of the IRTS 322 that is always less than a diameter of an aperture 325 that is defined through the chamber body 304 (as best seen in FIG. 3B). Similarly, when the IRTS 322 is fixedly mounted to the bracket 326 (e.g., the IRTS 322 is not movable in the vertical direction), a fixed position of the IRTS 322 relative to the view port 324 provides a field of view of the IRTS 322 that is always less than a diameter of an aperture 325 that is defined through the chamber body 304.

Figure 3C:
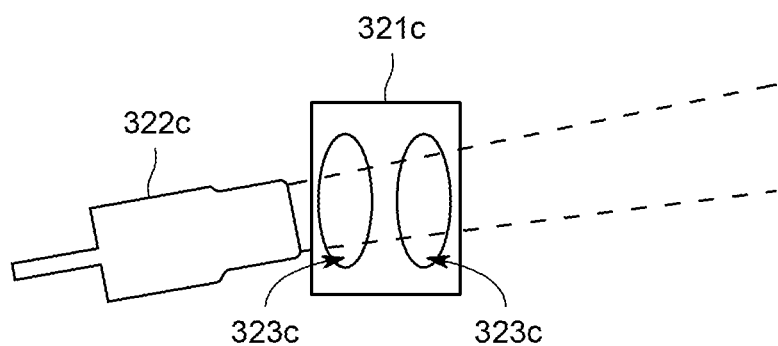
FIG. 3C is a diagram of a temperature sensing apparatus in accordance with one or more embodiments of the present disclosure.

One or more optional devices can be used to direct (or focus) a beam (e.g., infrared electromagnetic energy), output from the IRTS 322 for scanning the substrates 310, through the view port 324 to ensure that the field of view of the IRTS 322 is always less than a diameter of an aperture 325. For example, with reference to FIG. 3C, in some embodiments, a Faraday cage 321c having one or more apertures 323c (two shown in FIG. 3C) can be operably coupled to an IRTS 322c, which is identical to the IRTS 322, (or the view port 324) so that the beam emitted from the IRTS 322c can pass through the Faraday cage 321 and the view port 324 to ensure that the field of view of the IRTS 322c is always less than a diameter of an aperture 325.

The view port 324 can be mounted to an inside of the process chamber 302 using one or more devices, including, but not limited to, clamps, plates, O-rings, gaskets, brackets, etc. For example, in some embodiments, the view port 324 can be mounted inside a space or cavity defined within a chamber wall of the process chamber 302 using a mounting bracket assembly 331 that includes one or more 0-rings or centering ring 333 and a clamp 335.

A diameter of the aperture 325 can be about 5 millimeters to about 10 millimeters, but should not exceed one quarter wavelength of a wavelength of the energy used to process the substrates 310, e.g., to minimize and/or prevent leakage of energy that is used to process the substrates 310. For example, in some embodiments, such as when the process chamber 302 is a microwave chamber, microwave leakage could be potentially deleterious to an operator and/or could make reaching a temperature for processing one or more of the substrates 310 difficult. Accordingly, the inventors have found that when the process chamber 302 is a microwave chamber, the diameter of the aperture 325 should be about one quarter of microwave wavelength. The inventors have also found that, in some embodiments, a field of view through the aperture 325 should form an optical ellipse on one or more of the substrates 310 (e.g., an elliptical field of view). The optical ellipse allows the IRTS 322 to scan the substrate surface along a major diameter of the optical ellipse to obtain a temperature of one or more of the substrates 310, during operation.

An angle of incidence of a beam, output from the IRTS 322 for scanning the substrates 310, relative to the substrates 310 can be any suitable angle. For example, in some embodiments, the angle of incidence of a beam can be about three degrees to about seven degrees. Various factors can be used to determine the angle of incidence and can include, but are not limited to, a distance that the IRTS 322 is from the substrates 310, a spacing between each of the substrates 310a-310c of the substrates 310, an angle of incidence that avoids or limits interference caused from other material present in the processing volume of the process chamber 302 when the substrates 310 are being processed, an angle of incidence that provides a maximum field of view on the substrates 310, etc.

Figure 4:
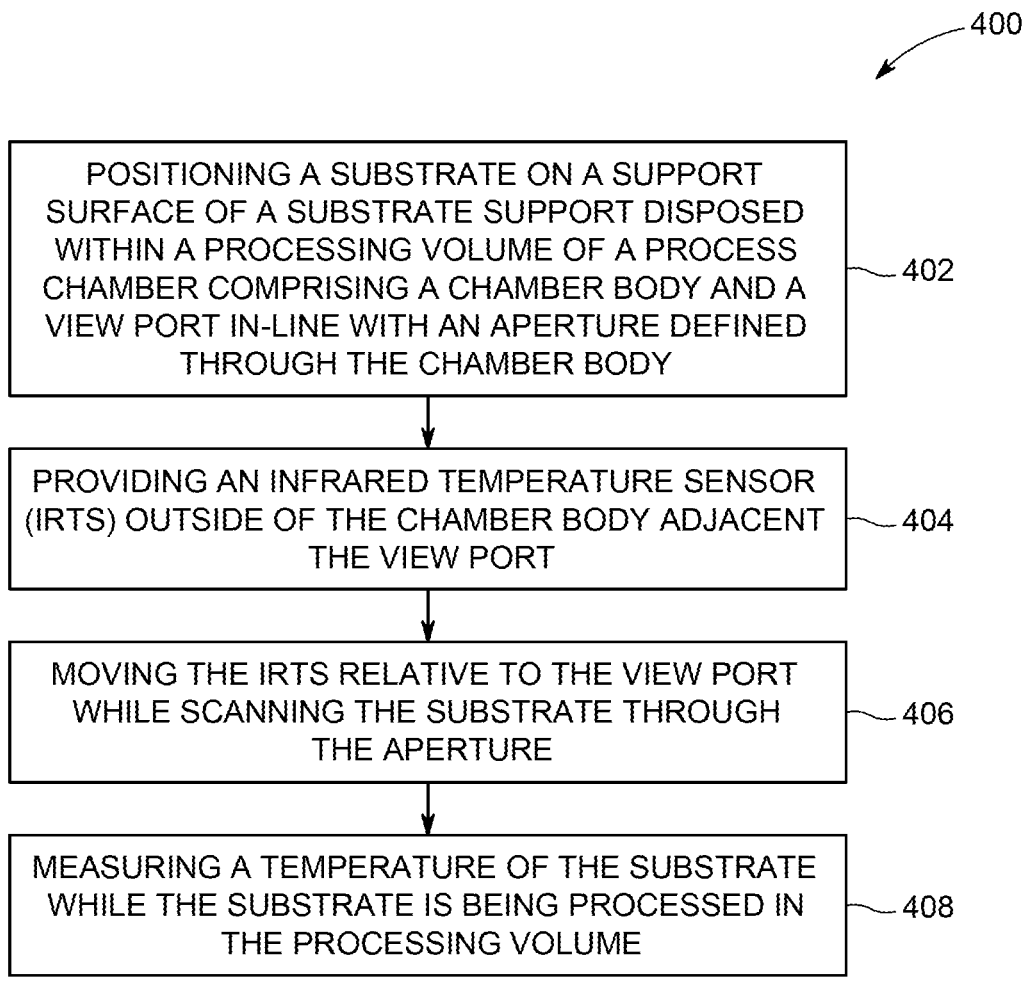
FIG. 4 is a flowchart of method for processing a substrate in accordance with one or more embodiments of the present disclosure.

FIG. 4 is a flowchart of method 400 for processing a substrate, e.g., one or more of the substrates 110a-110c, in accordance with one or more embodiments of the present disclosure. At 402, a substrate can be positioned on a support surface of a substrate support, e.g., one of the substrate carrier 118a-118c, disposed within a processing volume, e.g., the processing volume 106, of a process chamber, e.g., the process chamber 102.

Next, at 404 an IRTS, e.g., the IRTS 122 can be provided outside of the chamber body 104 of the process chamber 102 and adjacent a view port, e.g., the view port 124. Next, at 406 the IRTS can scan one or more of the substrates through the view port and an aperture, e.g., the aperture 325. For example, if the aperture is configured to provide a field of view for more than one substrate, the IRTS can be moved vertically along the bracket to scan as many substrates that are in the that field of view. In some embodiments, under the control of the controller 130, the IRTS can scan the substrate (s), as the substrate(s) is/are being processed in the process chamber. As noted above, the IRTS will positioned on the bracket such that any fixed position of the IRTS relative to the view port and/or the aperture provides a field of view at which the substrates are scanned that is always less than a diameter of the aperture, e.g., the IRTS is moved so that the beam can be transmitted through the aperture, without interference.

During the scanning of the substrates, at 408, a temperature of the substrates can be measured while the substrates are being processed in the processing volume. The IRTS can, for example, detect the infrared energy emitted by the substrate(s) and based on one or more of a voltage output reference, voltage slope and/or voltage offset (or other electrical parameter) can determine the temperature for each of the substrates. The controller receives the temperature measurements from the IRTS to control a temperature of each of the substrates, e.g., by controlling the power source. For example, when the process chamber is a microwave chamber which can be configured, for example, to perform a degas process on the substrates, the controller can control one or more of the heat sources 128 (e.g., a microwave heater) to limit an amount of heat energy that is received and radiated within the processing volume of the process chamber.

Figure 5A:
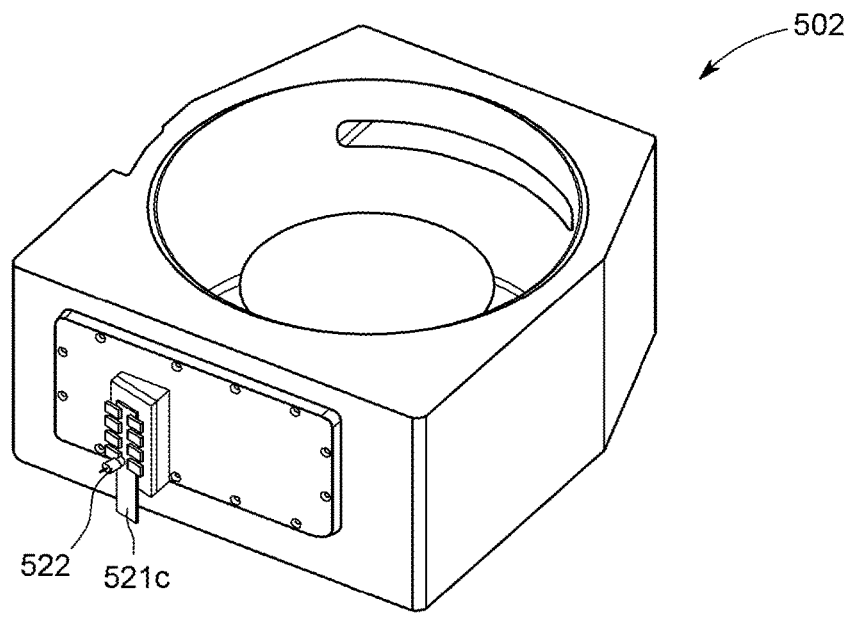
FIG. 5A is a perspective, cut-away view of a portion of a process chamber including a temperature measuring apparatus in accordance with one or more embodiments of the present disclosure.
Figure 5B:
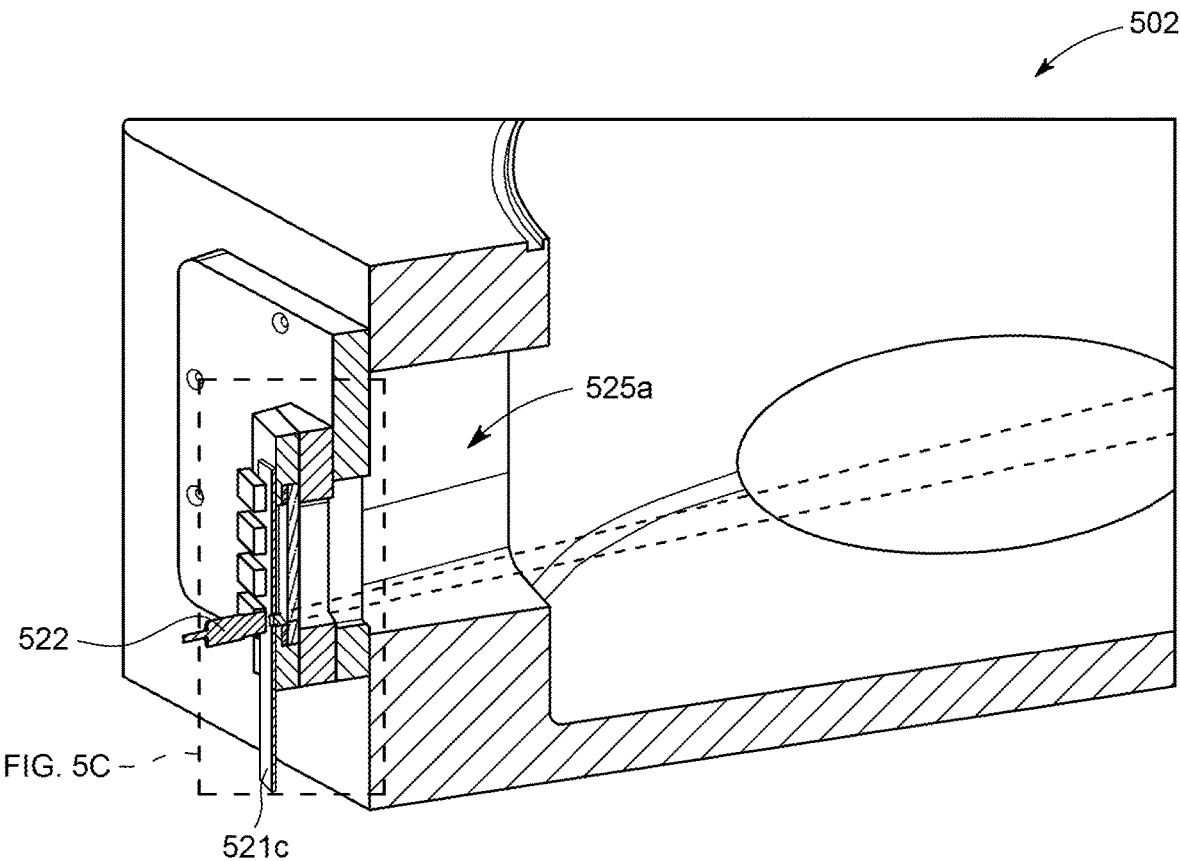
FIG. 5B is a partial, cutaway view of the process chamber including a temperature measuring apparatus in accordance with one or more embodiments of the present disclosure.

FIG. 5A is a perspective view of a portion of a process chamber 502 including a temperature measuring apparatus in accordance with one or more embodiments of the present disclosure. The process chamber 502 and the temperature measuring apparatus are substantially identical to the previously described process chambers and temperature measuring apparatus. Accordingly, only those features that are unique to the process chamber 502 and the temperature measuring apparatus are herein described.

Figure 5C:
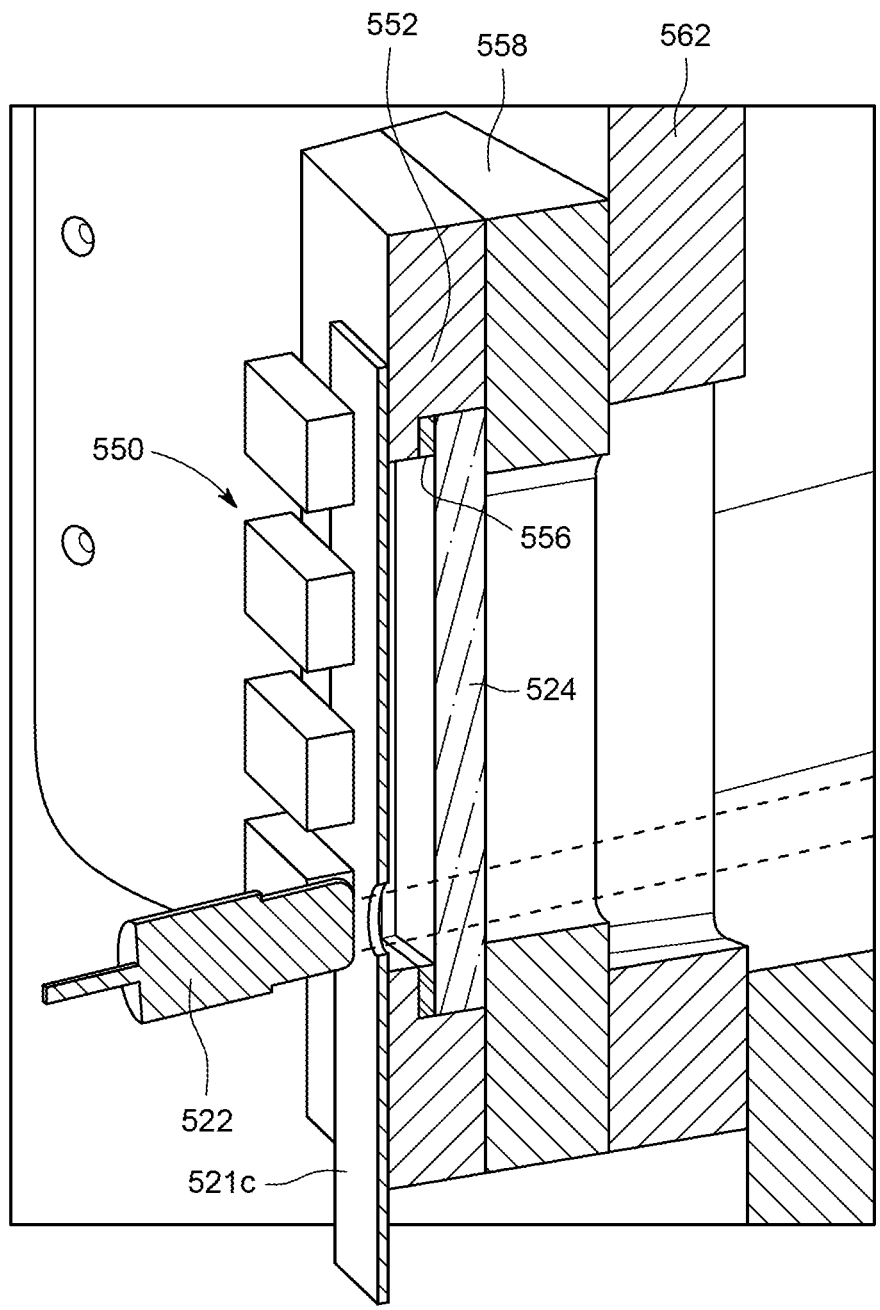
FIG. 5C is an enlarged area of detail of FIG. 5B in accordance with one or more embodiments of the present disclosure.
Figure 5D:
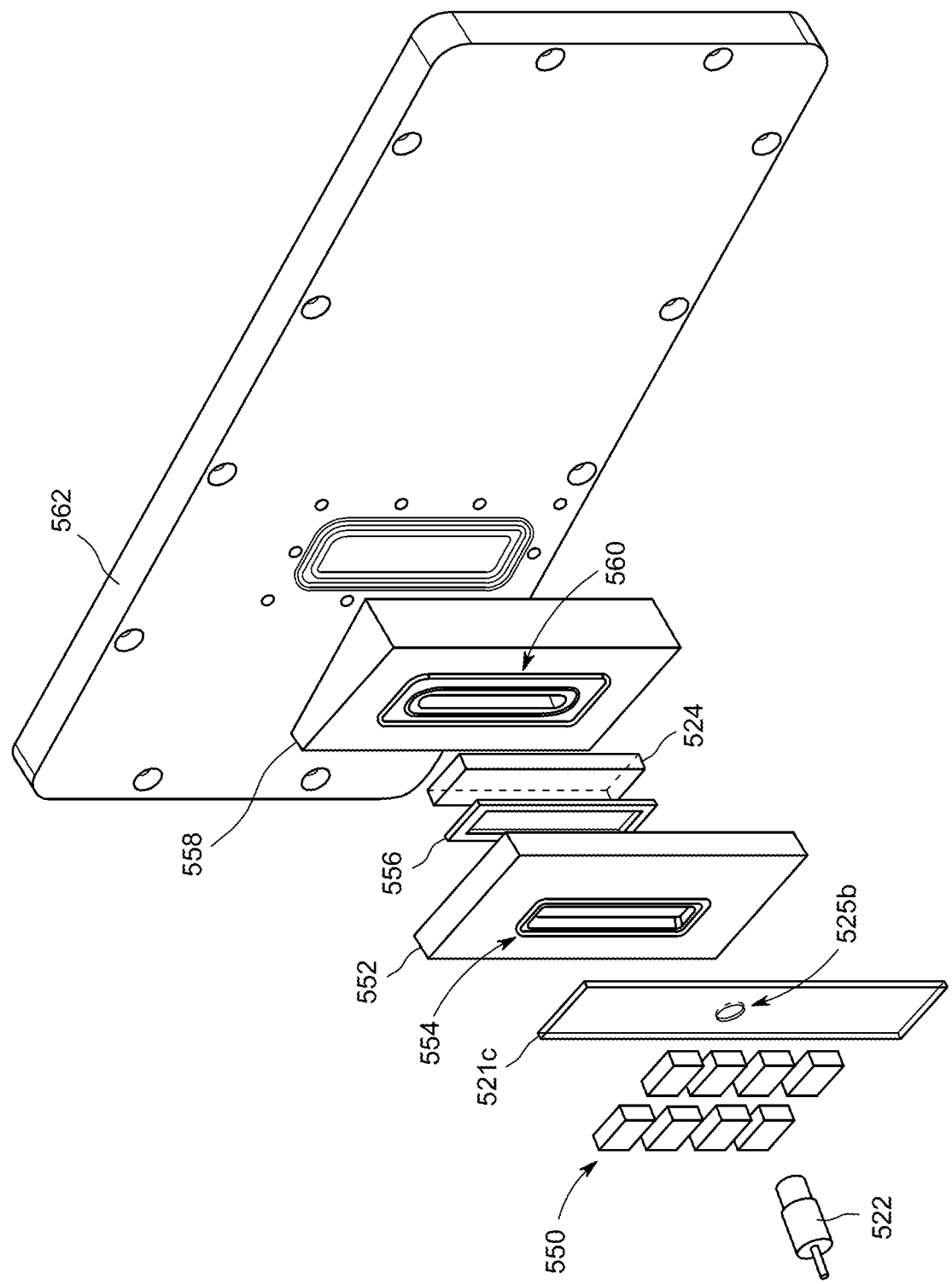
FIG. 5D is an exploded view of the components of the temperature measuring apparatus in accordance with one or more embodiments of the present disclosure.

The process chamber 502 can be configured for processing one or more substrates, but unlike the process chamber 302, however, the process chamber 502 includes an aperture 525a (or slot) having a diameter and/or length that is relatively large compared the aperture 325. More particularly, the inventors have found that in some instances, such as when a chamber is configured for high throughput (e.g., for processing a large amount of multiple batches of substrates), the aperture 525a defined in the chamber has to be large enough so that the IRTS 522 can be moved vertically along the bracket to be able to scan all of the substrates in the multiple batches of substrates in a single pass. However, as noted above, because there is a slight chance of processing energy escaping through the aperture 525a (e.g., if the slot is too large), one or more metal plates 521c (or baffles) are positioned between the IRTS 522 and a view port 524 (see FIGS. 5C-5D).

The metal plate 521c, which can be made from any suitable metal, includes one or more apertures that are configured to allow a beam outputted from the IRTS 522, for scanning the substrates, to pass through a view port 524. In at least some embodiments, one aperture 525b can be positioned through the metal plate 521c. As described above, the aperture 525b has a diameter that is configured to minimize and/or prevent leakage of energy that is used to process the substrates, e.g., not greater than about one quarter wavelength of a wavelength of energy used to process the substrates.

The metal plate 521c is moveable in a vertical direction as the IRTS 522 moves along the post of the bracket in the vertical direction during operation, so that the beam outputted from the IRTS is able to be transmitted through the aperture 525b and the view port 524. Accordingly, one or more tabs are provided and are configured to support the metal plate 521c as the metal plate 521c is moved in the vertical direction. In some embodiments, for example, a plurality of tabs 550 (e.g., eight tabs shown in the Figures) are provided and are coupled, using one or more of screws, bolts, or other fastening devices, to a metal block 552.

The metal block 552 includes a cutout 554 (see FIG. 5D) of suitable configuration that is similar to the view port 524, e.g., a generally rectangular configuration. One or more suitable gaskets (not explicitly shown) can be seated within or around the cutout 554 to provide shielding from the energy that is used for processing the substrates. In some embodiments, the one or more gaskets (or O-rings) can be seated around the cutout 554 and between the metal plate 521c and the metal block 552. The gaskets can be made from any suitable material including, but not limited to, plastic (e.g., thermoplastic), foam, rubber, etc.

Disposed between the metal block 552 and the view port 524 can be one or more protective barriers that are configured to prevent the metal block 552 from pressing directly against the view port 562524 when the metal plate 521c is coupled to the process chamber 502. The one or more barriers can be, for example, one or more additional gaskets, or other type of barrier. In some embodiments, for example, the barrier can be a rectangular overlay 556 that partially covers a front face of the view port 524 along a perimeter thereof. Similar to the gasket seated in the cutout 554, the overlay 556 can be made from any suitable material including, but not limited to, plastic (e.g., thermoplastic), foam, rubber, etc.

The view port 524 is positioned between the metal block 552 and an additional metal block 558. More particularly, one or more of the metal blocks 552 and 558 can include a recessed or grooved region 560 in which the view port 524 is seated. For illustrative purposes, only a recessed region 560 is shown in the metal block 558. One or more gaskets (or O-rings) can be provided within the recessed region 560. Compressing the view port 524 between the metal blocks 552 and 558 provides a vacuum seal for maintaining the energy used for processing the substrates within the processing volume of the process chamber 502.

In some embodiments, the metal plate 521c including the tabs 550, the metal blocks 552 and 558, and the view port 524 including the overlay 556 can be mounted within a cavity inside a wall of the process chamber 502 adjacent the aperture 525a, as described above. In such an embodiment, the IRTS 522 can be mounted to a mounting bracket, e.g., the bracket 326, that is connected to an outside wall of the process chamber 502 and can be in-line with the aperture 525b defined through the metal plate 521c.

Alternatively, in some embodiments, the tabs 550, the metal blocks 552 and 558, and the view port 524 including the overlay 556 can be mounted to an outside wall of the process chamber 502 adjacent the aperture 525a, using, for example, one or more of nuts, bolts, screws, clamps, etc. In some embodiments, for example, the tabs 550, the metal blocks 552 and 558, and the view port 524 including the overlay 556 can be mounted to a metal plate 562 that can be used as a mounting device that mounts to the outside wall, using one more suitable mounting devices (e.g., nuts, bolts, screws, clamps etc.), of the process chamber 502, as illustrated in FIGS. 5A-5D. In such an embodiment, one or more gaskets or O-rings (not explicitly shown) can be provided between the metal block 558 and the metal plate 562 and/or between the metal plate 562 and the outside wall of the process chamber 502. When the metal plate 562 is used, the IRTS 522 can again be mounted to the mounting bracket, e.g., the bracket 326, that is connected to an outside wall of the process chamber 502 (or the metal plate 562), and can be in-line with the aperture 525b through the metal plate 521c. Additionally, when the metal plate 562 is used, the temperature measuring apparatus can be sold as a kit and configured to couple to the process chamber 502 and/or one or more other types of process chambers.

Use of the IRTS 522 is substantially similar to the IRTS 322. For example, under control of a controller, e.g., the controller 130, the IRTS 522 can scan one or more of the substrates so that a temperature of the substrates can be measured while the substrates are being processed in the processing volume of the process chamber 502.

For example, the controller can move the IRTS 522 vertically along the post of the bracket (e.g., to which the IRTS 522 can be coupled to). The controller can also move the metal plate 521c in synchronization with the IRTS 522 so that the IRTS 522 stays in-line with the aperture 525b of the metal plate 521c to scan the one or more of the substrates through the view port 524. However, since the view port 524 and the aperture 525a defined through the process chamber wall of the process chamber 502 each have a diameter and/or length that is greater than the aperture 525b, an overall relative field of view that the IRTS 522 sees is greater than the field of view that the aperture 525b alone can provide, e.g., the aperture 525b can only provide a field of view that is about one quarter wavelength of a wavelength of energy used to process the substrates. Thus, the IRTS 522 can scan a relatively large number of substrates through the view port 524 to obtain temperature measurements thereof, while ensuring no leakage of energy through the aperture 525b while the substrates are being processed.

During the scanning of the substrates, the IRTS 522 can detect the infrared energy emitted by the substrates and based on one or more of a voltage output reference, voltage slope and/or voltage offset (or other electrical parameter) can determine the temperature for each of the substrates. The controller receives the temperature measurements from the IRTS 522 to control a temperature of each of the substrates, e.g., by controlling the power source. For example, when the process chamber is a microwave chamber which can be configured, for example, to perform a degas process on the substrates, the controller can control one or more of the heat sources 128 (e.g., a microwave heater) to limit an amount of heat energy that is received and radiated within the processing volume of the process chamber.

Figure 5E:
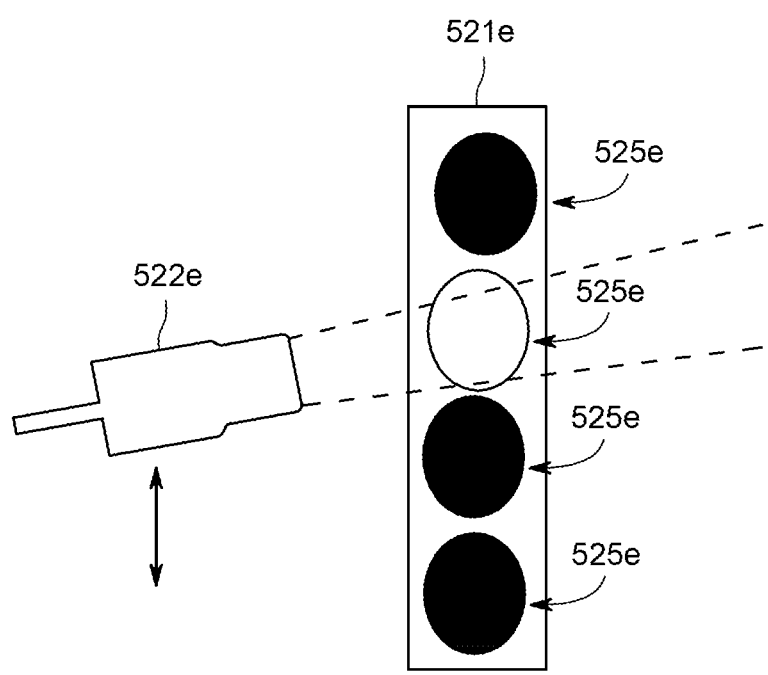
FIG. 5E is a diagram of a temperature sensing apparatus in accordance with one or more embodiments of the present disclosure.

In some embodiments, not having the metal plate 521c move with the IRTS 522 may prove advantageous. In such embodiments, a metal plate 521e can include a plurality of vertically aligned apertures 525e (four shown in FIG. 5E). As the IRTS 522e moves vertically along the post of the bracket, the beam from the IRTS 522e can be transmitted through one aperture at a time. For illustrative purposes, the beam is shown being transmitted through the second aperture 525e from the top.

While the foregoing is directed to embodiments of the present disclosure, other and further embodiments of the disclosure may be devised without departing from the basic scope thereof.

The invention claimed is:

1. An apparatus for processing a substrate, comprising:
a process chamber comprising a chamber body defining a processing volume and having a view port coupled to the chamber body;
a substrate support disposed within the processing volume and having a support surface to support a substrate; and
an infrared temperature sensor (IRTS) disposed outside the chamber body adjacent the view port to measure a temperature of the substrate when being processed in the processing volume, the IRTS movable relative to the view port for scanning the substrate through the view port,
wherein an angle of incidence of a beam, output from the IRTS for scanning the substrate, relative to the substrate creates an elliptical field of view.

2. The apparatus of claim 1, wherein the IRTS is located at a position relative to the view port such that a field of view of the IRTS is always less than a diameter of an aperture defined in the processing volume of the chamber body.

3. The apparatus of claim 2, wherein the diameter of the aperture does not exceed one quarter of a wavelength of energy used to process the substrate.

4. The apparatus of claim 1, wherein the IRTS is mounted on a bracket coupled to a side of the chamber body and is movable in a vertical direction along the bracket.

5. The apparatus of claim 1, wherein the process chamber is a microwave chamber.

6. The apparatus of claim 1, further comprising a controller that is operably coupled to the IRTS and a power source used for processing the substrate,
wherein the controller receives an input from the IRTS in response to scanning the substrate and analyzes the input for controlling the power source such that the temperature of the substrate does not exceed a threshold while the substrate is being processed.

7. The apparatus of claim 1, wherein the substrate support comprises a plurality of support surfaces for receiving and supporting a corresponding plurality of substrates.

8. The apparatus of claim 1, further comprising a metal plate that is positioned adjacent the view port, the metal plate including at least one aperture that is configured to direct a beam output from the IRTS for scanning the substrate through the view port.

9. A method for substrate packaging comprising:
positioning a substrate on a support surface of a substrate support disposed within a processing volume of a process chamber comprising a chamber body and a view port coupled to the chamber body;
providing an infrared temperature sensor (IRTS) outside of the chamber body adjacent the view port;
moving the IRTS relative to the view port to scan the substrate through the view port; and
measuring a temperature of the substrate while the substrate is being processed in the processing volume,
wherein scanning the substrate comprises outputting a beam from the IRTS at an angle of incidence relative to the substrate that creates an elliptical field of view.

10. The method of claim 9, wherein the IRTS is located at a position relative to the view port such that a field of view of the IRTS is always less than a diameter of an aperture defined in the processing volume of the chamber body.

11. The method of claim 10, wherein the diameter of the aperture does not exceed one quarter of a wavelength of energy used to process the substrate.

12. The method of claim 9, wherein moving the IRTS comprises moving the IRTS in a vertical direction along a bracket coupled to a side of the chamber body.

13. The method of claim 9, further comprising receiving, at a controller that is operably coupled to the IRTS and a power source used for processing the substrate, an input from the IRTS in response to scanning the substrate and analyzing the input for controlling the power source such that the temperature of the substrate does not exceed a threshold while the substrate is being processed.

14. The method of claim 9, wherein scanning the substrate through the view port comprises scanning a plurality of substrates.

15. The method of claim 9, wherein scanning the substrate through the view port comprises directing a beam through at least one aperture defined through a metal plate that is positioned adjacent the view port.

16. A non-transitory computer readable storage medium having stored thereon instructions that when executed by a processor cause the processor to perform a method for substrate packaging comprising:
positioning a substrate on a support surface of a substrate support disposed within a processing volume of a process chamber comprising a chamber body and a view port coupled to the chamber body;
providing an infrared temperature sensor (IRTS) outside of the chamber body adjacent the view port;
moving the IRTS relative to the view port to scan the substrate through the view port; and
measuring a temperature of the substrate while the substrate is being processed in the processing volume,
wherein scanning the substrate comprises outputting a beam from the IRTS at an angle of incidence relative to the substrate that creates an elliptical field of view.

17. The non-transitory computer readable storage medium of claim 16, wherein moving the IRTS comprises moving the IRTS in a vertical direction along a bracket coupled to a side of the chamber body.

\* \* \* \* \*